United States Patent [19]
Kado et al.

[11] Patent Number: 5,206,589
[45] Date of Patent: Apr. 27, 1993

[54] METHOD OF MEASURING VECTOR MAGNETIC FLUX BY PERFORMING CURVED SURFACE INTERPOLATION WITH DATA OBTAINED BY PLURAL SQUID TYPE VECTOR MAGNETIC FLUX METERS, AND APPARATUS FOR CARRYING OUT THE SAME

[75] Inventors: Hisashi Kado, Kashiwa; Tomoaki Ueda, Kyoto, both of Japan

[73] Assignees: Agency of Industrial Science & Technology; Daikin Industries, Ltd., Japan

[21] Appl. No.: 766,344

[22] Filed: Sep. 27, 1991

[30] Foreign Application Priority Data

Sep. 30, 1990 [JP] Japan ................... 2-262014

[51] Int. Cl.$^5$ .............. G01R 33/035; A61B 5/05; G06G 7/30
[52] U.S. Cl. ............... 324/248; 128/653.1; 364/577; 505/846
[58] Field of Search ............... 324/248; 128/653.1; 307/306; 505/846; 364/577

[56] References Cited

U.S. PATENT DOCUMENTS

| 4,591,787 | 5/1986 | Hoenig | 324/248 |
| 4,749,946 | 6/1988 | Hoenig | 324/248 |
| 4,771,239 | 9/1988 | Hoenig | 324/248 |

FOREIGN PATENT DOCUMENTS

| 187267 | 8/1987 | Japan | 324/248 |
| 131083 | 6/1988 | Japan | 324/248 |

Primary Examiner—Gerard R. Strecker
Attorney, Agent, or Firm—Beveridge, DeGrandi, Weilacher

[57] ABSTRACT

Plural vector magnetic flux meters are disposed based on predetermined relationships in their positions, to obtain vector magnetic flux at plural points. The obtained vector magnetic flux includes magnetic flux components in plural directions. Curved surface interpolation is carried out based on the magnetic flux components in the corresponding direction to obtain magnetic flux components for arbitrary points. Magnetic flux components in plural directions for an arbitrary point are obtained by selecting the obtained magnetic flux components for the arbitrary point belonging to a region which overlaps with all interpolation regions for corresponding magnetic flux components of the magnetic flux. Vector magnetic flux corresponding to a condition that differences between positions of pickup coils of corresponding vector magnetic flux meters and the predetermined position of the vector magnetic flux meter are supposed to be 0, are obtained based on the obtained magnetic flux components in plural directions and the relative positions of the pickup coils.

2 Claims, 6 Drawing Sheets

Fig. 2
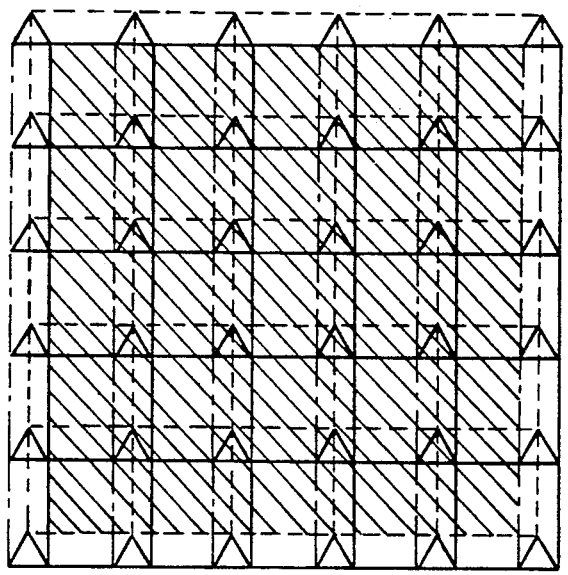
Fig. 3(A)
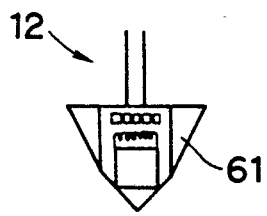
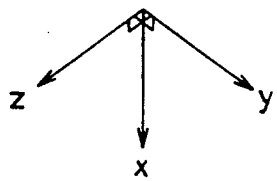
Fig. 3(B)
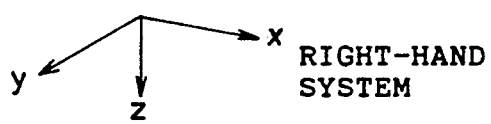
RIGHT-HAND SYSTEM
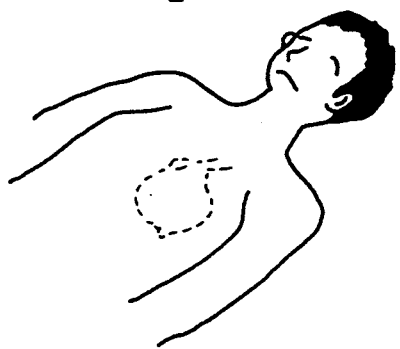

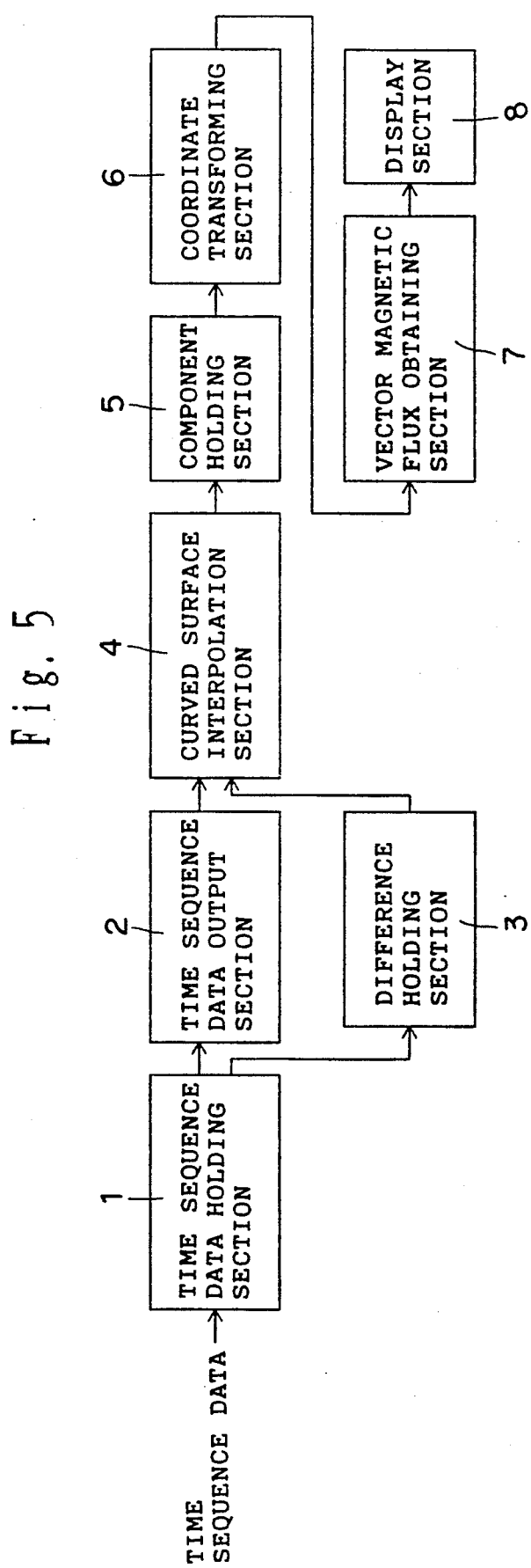

METHOD OF MEASURING VECTOR MAGNETIC FLUX BY PERFORMING CURVED SURFACE INTERPOLATION WITH DATA OBTAINED BY PLURAL SQUID TYPE VECTOR MAGNETIC FLUX METERS, AND APPARATUS FOR CARRYING OUT THE SAME

BACKGROUND OF THE INVENTION

The present invention relates to a method and apparatus for measuring vector magnetic flux. More particularly, the present invention relates to a method and apparatus for measuring vector magnetic flux based on magnetic flux components detected by corresponding pickup coils of plural magnetic flux meters which are disposed based on their predetermined relative positions, each magnetic flux meter including a body which has three faces crossing at right angles with respect to one another, and three pickup coils of corresponding superconducting quantum interference device magnetic flux meters including superconducting quantum interference devices (hereinafter referred to as SQUIDs) disposed on the corresponding faces of the body.

It is known that a SQUID is capable of detecting magnetic flux with extremely high sensitivity. To take notice of this characteristic, a SQUID is applied to various apparatus which are used in various technical fields. When magnetic fields of living organisms are to be measured, the magnetic flux at plural points present in a predetermined plane are measured by plural SQUID magnetic flux meters, then the magnetic flux at all points within the corresponding plane are calculated by performing linear interpolation, spline interpolation and the like based on the measured magnetic flux.

When not only the intensity of the magnetic flux but also the directions of the magnetic flux are to be taken into consideration, the magnetic flux at plural points are measured by plural vector magnetic flux meters, each vector magnetic flux meter including a mounting block 61 which has three faces 61a, 61b, 61c crossing at right angles, and three pickup coils 62a, 62b, 62c of a SQUID magnetic flux meter disposed on the corresponding faces of the mounting body 61 (refer to FIGS. 6(A), 6(B), and 6(C), then interpolation operations are carried out based on the measured vector magnetic flux. When it is supposed that the vector magnetic flux is measured accurately, the vector magnetic flux at all points within the corresponding plane is calculated accurately by performing interpolation operations based on the measured magnetic flux.

Vector magnetic flux obtained by vector magnetic flux meters actually includes an error, thereby calculated vector magnetic flux eventually includes an error. The cause of the errors is described in detail. The vector magnetic flux meter is used by positioning the pointed end 61d of the mounting block 61 closest to a measuring point and by supposing that obtained magnetic flux components in three directions are measured at a point 61e as a center of the vector magnetic flux meter. The point 61e is a center of gravity of a triangle which is defined by the centers 62d, 62e and 62f of the pickup coils 62a, 62b and 62c as apexes of the triangle (refer to FIG. 6(D) showing the triangle in broken lines). The centers 62d, 62e and 62f of the pickup coils 62a, 62b, 62c are actually apart from the center 61e of the vector magnetic flux meter by about 1 cm (refer to FIG. 6(B)), thereby magnetic flux components in corresponding directions are measured at different points with respect to one another. As a result, real vector magnetic flux at the center 61e of the vector magnetic flux meter cannot be measured. Furthermore, when the magnetic field is measured at plural points, plural vector magnetic flux meters are generally disposed at every distance of 2.5–4 cm causing the ratio of the distance between the center 61e of the vector magnetic flux meter and the center of the pickup coils to the disposition distance of the vector magnetic flux meters to increase to a value. Thereby, vector magnetic flux measurement error also is generated based on the increase of the ratio. Especially, when magnetic fields of living organisms are to be measured, the magnetic fields may have a fairly high gradient of spacial magnetic field. When the magnetic field has a fairly high gradient of spacial magnetic field, differences between measured magnetic flux components in corresponding directions and real magnetic flux components in corresponding directions, remarkably increase due to the distances between the center 61d of the vector magnetic flux meter and the centers of the pickup coils.

Diameters of the pickup coils may be decreased so as to decrease the distance between the pickup coils, to dissolve the disadvantages above-mentioned. A disadvantage arises in that the sensitivity of the vector magnetic flux meter is eventually lowered due to the decrease in the diameters of the pickup coils, thereby the signal to noise ratio is degraded.

SUMMARY OF THE INVENTION

It is an object of the present invention to accurately measure vector magnetic flux.

It is another object of the present invention to decrease measurement error which is essential to a vector magnetic flux meter to a great extent.

To perform the objects above-mentioned, a method for measuring vector magnetic flux according to the present invention comprises the steps of;

measuring vector magnetic flux which includes magnetic flux components in plural directions using plural vector magnetic flux meters, each vector magnetic flux meter having plural SQUID flux meters, performing curved surface interpolation based on the measured magnetic flux components in each corresponding direction, and obtaining the vector magnetic flux at arbitrary points belonging to a region which overlaps with all interpolation regions for corresponding magnetic flux components of the vector magnetic flux.

When this method is employed, plural vector magnetic flux meters are disposed based on predetermined relative positions. Each vector magnetic flux meter includes a body which has plural faces crossing at right angles to one another and plural pickup coils of corresponding SQUID flux meters disposed on corresponding faces of the body. Vector magnetic flux within a predetermined extent is obtained based on measured vector magnetic flux by the vector magnetic flux meters. In this case, curved surface interpolations are performed based on magnetic flux components in each corresponding direction of measured vector magnetic flux so as to obtain magnetic flux components in each corresponding direction at arbitrary points within the predetermined extent. Then, magnetic flux components in all directions at a desired point are extracted based on the measured and obtained magnetic flux components. Thereafter, the vector magnetic flux which is equivalent to an ideal vector magnetic flux measured by a supposed vector magnetic flux meter in which distances between the centers of the pickup coils are determined to be 0, is obtained based on the extracted magnetic flux components and the relative positions of the pickup coils of the vector magnetic flux meter.

Summarizing the above, vector magnetic flux error is greatly decreased by performing curved surface interpolation based on magnetic flux components in corresponding directions, and by obtaining magnetic flux components according to a supposed condition that distances between centers of pickup coils are determined to be 0 based on the curved surface interpolation results, despite that magnetic flux components obtained by SQUID magnetic flux meters of the vector magnetic flux meter are at different points spaced apart by the distance between the centers of the pickup coils and that the vector magnetic flux obtained by the magnetic flux components eventually includes an error.

To perform the objects above-mentioned, an apparatus for measuring vector magnetic flux according to the present invention comprises;

vector magnetic flux storing means for storing magnetic flux obtained by the corresponding SQUID magnetic flux meters as magnetic flux components in corresponding directions of a vector magnetic flux, curved surface interpolation means for reading out magnetic flux components in the corresponding direction from the vector magnetic flux storing means and for performing curved surface interpolation based on the read out magnetic flux components, and vector magnetic flux obtaining means for obtaining vector magnetic flux at an arbitrary point within a region which overlaps with all interpolation regions for corresponding magnetic flux components of vector magnetic flux, based on the relative positions of plural pickup coils and the curved surface interpolation results of magnetic flux components in corresponding directions.

When this apparatus is employed, plural vector magnetic flux meters are disposed based on their predetermined relative positions, each vector magnetic flux meter including a body which has plural faces crossing at right angles to one another and plural pickup coils of corresponding SQUID flux meters disposed on corresponding faces of the body. Vector magnetic flux within a predetermined extent are obtained based on measured vector magnetic flux by the vector magnetic flux meters. In this case, magnetic flux measured by the corresponding SQUID magnetic flux meters is stored in the vector magnetic flux storing means as magnetic flux components in corresponding directions of the vector magnetic flux. The curved surface interpolation means reads out magnetic flux components in each corresponding direction from the vector magnetic flux storing means and performs curved surface interpolations based on the read out magnetic flux components in each corresponding direction of measured vector magnetic flux so as to obtain magnetic flux components in each corresponding direction at arbitrary points within the predetermined extent. Then, the vector magnetic flux obtaining means obtain magnetic flux components in all directions at a desired point. These magnetic flux components are extracted based on the measured and obtained magnetic flux components, and the vector magnetic flux obtaining means obtains vector magnetic flux which is equivalent to an ideal vector magnetic flux measured by a supposed vector magnetic flux meter in which distances between the centers of the pickup coils are determined to be 0, based on the obtained magnetic flux components and the relative positions of the pickup coils of the vector magnetic flux meter.

Summarizing the above, vector magnetic flux error is greatly decreased by performing curved surface interpolation based on magnetic flux components in corresponding directions, and by obtaining magnetic flux components according to a supposed condition that distances between centers of the pickup coils are determined to be 0. This supposed condition provides accurate results despite that the magnetic flux components obtained by the SQUID magnetic flux meters correspond to different points which are spaced apart by the distance between the pickup coils and therefore the vector magnetic flux indicated by the magnetic flux components actually includes an error.

These and other objectives, features and advantages of the invention will be more readily understood upon consideration of the present invention, in conjunction with the accompanying drawings.

BRIEF DESCRIPTION OF THE DRAWINGS

FIG. 2 is a diagram useful in understanding a region which overlaps all interpolation operation regions in all directions;

FIG. 3(A) is a diagram illustrating a coordinate system which is determined based on a vector magnetic flux meter;

FIG. 3(B) is a diagram illustrating a coordinate system which is determined based on an object of measurement;

FIG. 5 is a block diagram showing an embodiment of an apparatus for measuring vector magnetic flux according to the present invention;

DETAILED DESCRIPTION OF THE PREFERRED EMBODIMENTS

Figure 1:
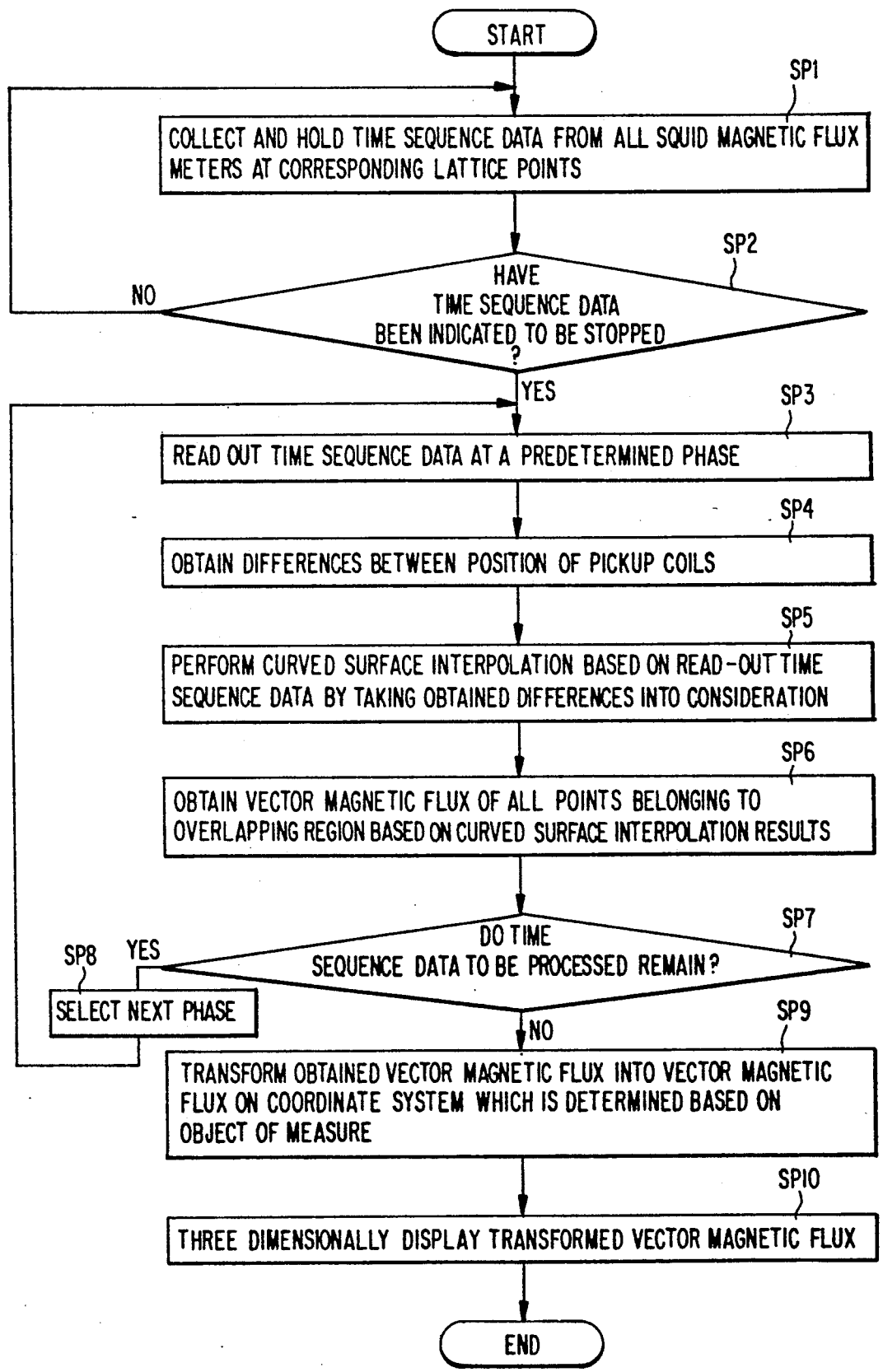
FIG. 1 is a flowchart illustrating an embodiment of a method for measuring vector magnetic flux according to the present invention.

A vector magnetic flux meter is illustrated in FIGS. 6(A), 6(B), 6(C) and 6(D). The vector magnetic flux meter 12 includes a mounting block 61 as a body which has three faces 61a, 61b and 61c crossing at right angles to one another and pickup coils 62a, 62b and 62c of SQUID magnetic flux meters, the pickup coils 62a, 62b and 62c being disposed on the corresponding faces. The mounting block 61 is supported by a supporting member 63 and plural superconductive transformers 64 are provided at upper predetermined positions with respect to the supporting member 63.

Figure 6A:
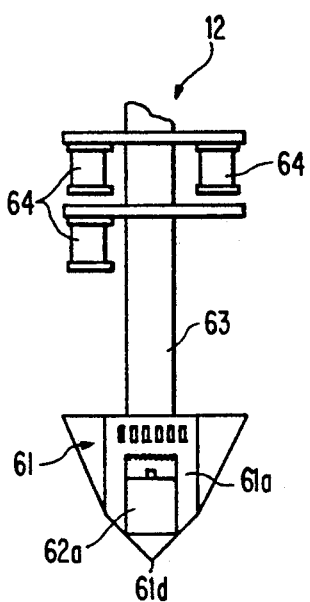
FIG. 6(A) is a side view of a vector magnetic flux meter together with superconducting transformers.
Figure 6B:
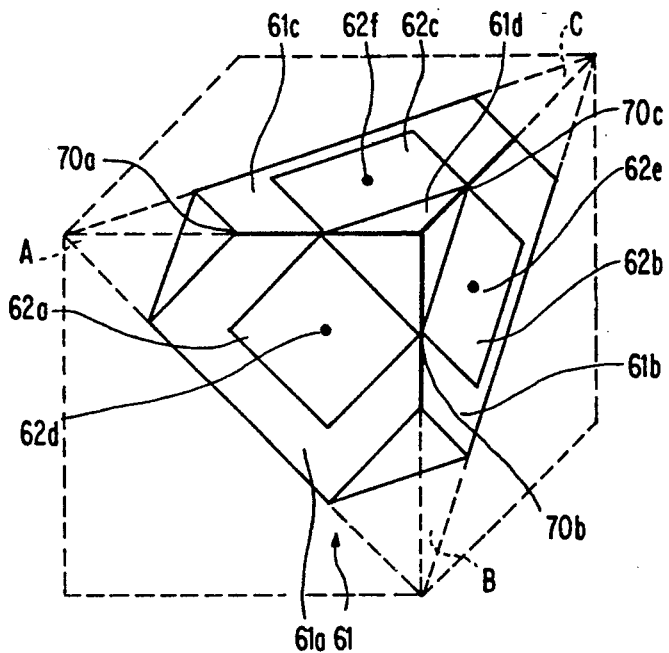
FIG. 6(B) is an enlarged perspective view of a vector magnetic flux meter.
Figure 6C:
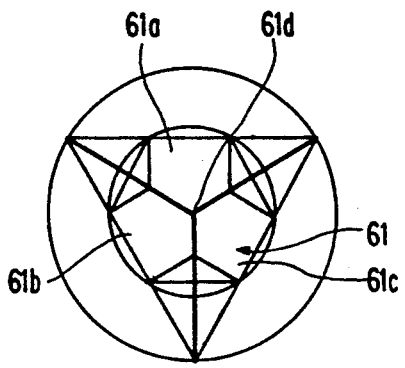
FIG. 6(C) is a bottom view of a vector magnetic flux meter.
Figure 6D:
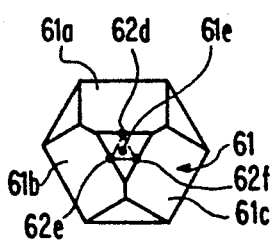
FIG. 6(D) is a diagram useful in understanding a center of a vector magnetic flux meter.
Figure 6E:
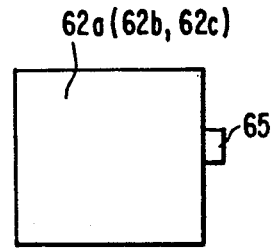
FIG. 6(E) is a front view of a pickup coil and a dc-SQUID.

The mounting block 61 is obtained by cutting a cube which is shown by a dashed line in FIG. 6(B) by a plane which is defined by three apexes 70a, 70b, 70c neighbouring a desired apex 61d of the cube and by cutting to remove sections A, B, and C while including the three apexes 70a, 70b, 70c. Three faces 61a, 61b and 61c of the mounting block uniting the apex 61d cross at right angles to one another. The mounting block 61 has rotary symmetry by 120 degrees with respect to the apex 61d when the mounting block 61 is seen from the apex-ward direction (refer to FIG. 6(C)). The pickup coils 62a, 62b and 62c are manufactured together with corresponding dc-SQUIDs 65 (refer to FIG. 6(E)), and are adhered at adjacent positions to the apex 61d on the corresponding faces 61a, 61b and 61c. A point 61e is determined to be the center of the vector magnetic flux meter 12. The point 61e is a center of gravity of the broken line triangle which is defined by the centers 62d, 62e and 62f of the pickup coils 62a, 62b and 62c as apexes of the triangle (refer to FIG. 6(D)). Output signals from the dc-SQUIDs 65 are supplied to corresponding magnetic flux locked loops (hereinafter referred to as FLLs) which are not shown in the figures, then the FLLs output magnetic flux detection signals which are proportional to magnetic flux detected by the corresponding pickup coils 62a, 62b and 62c.

Figure 7:
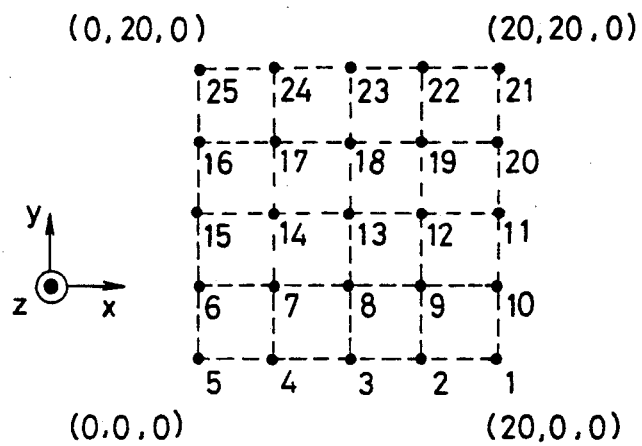
FIG. 7 is a diagram illustrating dispositions of plural vector magnetic flux meters.

FIG. 7 is a diagram illustrating dispositions of plural vector magnetic flux meters. A region of 20 cm × 20 cm is parceled out into 5 × 5 grids and vector magnetic flux meters 12 are disposed at corresponding lattice points.

FIG. 1 is a flowchart illustrating an embodiment of a method for measuring vector magnetic flux according to the present invention.

In step SP1, time sequence data which are time sequence data indicative of magnetic flux components in corresponding directions and are output from corresponding SQUID magnetic flux meters 12 of all vector magnetic flux meters disposed at corresponding lattice points, are collected and stored. The SQUID magnetic flux meter includes a corresponding pickup coil, a dc-SQUID and a corresponding FLL. In step SP2, it is judged whether or not collection of the time sequence data is indicated to be stopped. When it is judged in step SP2 that collection of time sequence data is not indicated to be stopped, then operation in step SP1 is carried out again. On the contrary, when it is judged in step SP2 that collection of time sequence data is indicated to be stopped, in step SP3, the time sequence data of corresponding lattice points generated at a predetermined phase (at a predetermined time) are read out from the stored time sequence data. In step SP4, differences between positions of centers of pickup coils of corresponding vector magnetic flux meters 12 are obtained. In step SP5, curved surface interpolation is performed by methods such as linear interpolation, least square method, space filtering and the like for magnetic flux components in corresponding directions based on the read out time sequence data by taking the obtained differences into consideration. In step SP6, vector magnetic flux of all points belonging to a region (hereinafter referred to as an overlapping region) (refer to a region to which is applied hatching in FIG. 2) which overlaps every interpolation region for magnetic flux components in corresponding directions are obtained based on the curved surface interpolation results for the magnetic flux components in corresponding directions. In step SP7, it is judged whether or not time sequence data which are to be processed still remain. When it is judged that time sequence data which are to be processed remain, in step SP8, the next phase (or next time) is selected, then processing in step SP3 is carried out again. On the contrary, when it is judged that time sequence data which are to be processed do not remain, in step SP9, vector magnetic flux on a coordinate system (refer to FIG. 3(A)) which is determined based on SQUID magnetic flux meters of the vector magnetic flux meter are transformed into vector magnetic flux on a coordinate system (refer to FIG. 3(B)) which is determined based on an object of measurement. In step SP10, vector magnetic flux are three dimensionally displayed based on the transformed vector magnetic flux, then the series of processings are finished.

As is apparent from the foregoing, the SQUID magnetic flux meters of each vector magnetic flux meter 12 obtain magnetic flux components in corresponding directions at different points which differ spacially from one another. The present invention obtains magnetic flux components in corresponding directions at all points which belong to the overlapping region by performing curved surface interpolation based on the detected magnetic flux components in corresponding directions, thereby accurate vector magnetic fluxes are obtained based on magnetic flux components in three directions at corresponding points.

Figure 4:
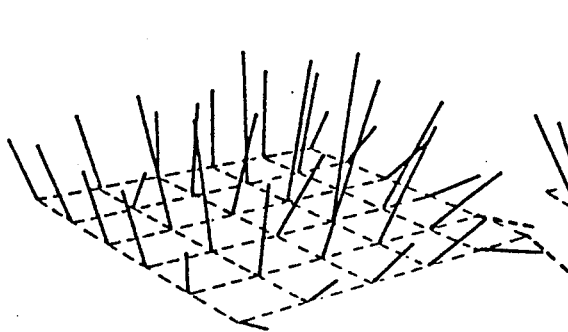
FIGS. 4(A), 4(B), 4(C) and 4(D) are diagrams illustrating display samples of vector magnetic flux measurement results.
Figure 4:
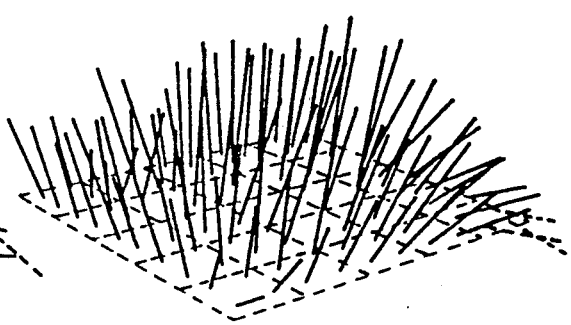
Figure 4:
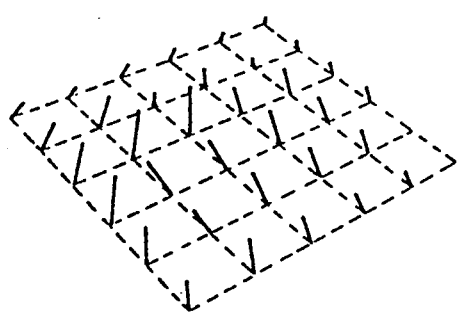
Figure 4:
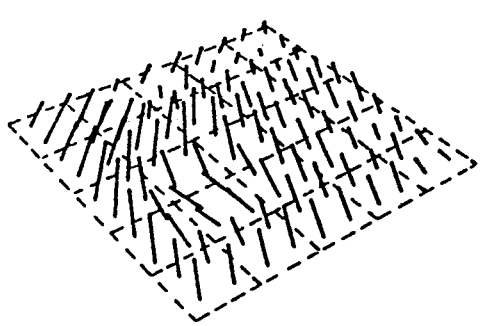

When the three dimensional display of vector magnetic flux is illustrated in FIGS. 4(A) and 4(B), the vector magnetic flux being measured by a conventional method by using 6 × 6 vector magnetic flux meters 12, the three dimensional display of vector magnetic flux distributions which are illustrated in FIGS. 4(C) and 4(D) are obtained by employing the method according to the present invention. That is, minute vector magnetic flux is obtained within the overlapping region which is narrowed by a predetermined region based on the relative positions of the pickup coils of the vector magnetic flux meter.

It is the most preferable that the least squares method or that spacial filtering is employed as the curved surface interpolation, measurement accuracy of vector magnetic flux is extremely improved. When a faint magnetic field such as the magnetic field of a living organism is to be measured, the least squares method is preferably employed so as to eliminate the influence of noise most efficiently.

SECOND EMBODIMENT

FIG. 5 is a block diagram showing an embodiment of an apparatus for measuring vector magnetic flux according to the present invention.

The apparatus comprises;

a time sequence data holding section 1 for holding time sequence data which are sequentially output from vector magnetic flux meters, the time sequence data including magnetic flux components in three directions, a time sequence data output section 2 for selecting time sequence data which are generated at a predetermined phase (or a predetermined time) and for outputting the selected time sequence data from the time sequence data holding section 1, a difference holding section 3 for obtaining spacial differences between centers of pickup coils of a vector magnetic flux meter and for holding the obtained spacial differences, a curved surface interpolation section 4 for performing curved surface interpolation based on the time sequence data selected and output by the time sequence data output section 2 by taking the differences supplied from the difference holding section 3 into consideration, component holding section 5 for holding interpolation values as magnetic flux components in corresponding directions of vector magnetic flux, a coordinate transforming section 6 for transforming the magnetic flux components held by the component holding section 5 into magnetic flux components on a coordinate system which is determined based on an object for measurement, a vector magnetic flux obtaining section 7 for obtaining vector magnetic flux by selecting the transformed magnetic flux components in all directions at a desired point, and a display section 8 for three dimensionally displaying the obtained vector magnetic flux.

When this apparatus is employed, time sequence data which are obtained by SQUID magnetic flux meters of vector magnetic flux meters, are held by the time sequence data holding section 1. The time sequence data output section 2 selects and outputs time sequence data which are generated at a predetermined phase (or a predetermined time) from the time sequence data holding section 1. Then, the curved surface interpolation section 4 performs an interpolation operation for magnetic flux components in corresponding directions based on the output time sequence data and by taking the differences held by the difference holding section 3 into consideration. The component data holding section 5 holds the interpolation values as magnetic flux components in corresponding directions of the vector magnetic flux. Thereafter, the coordinate transforming section 6 transforms the magnetic flux components which are held by the component data holding section 5 into magnetic flux components on a coordinate system which is determined based on an object of measurement. The vector magnetic flux obtaining section 7 obtains vector magnetic flux by selecting the transformed magnetic flux components in all directions at a desired point, then the display section 8 three dimensionally displays the obtained vector magnetic flux.

As is apparent from the foregoing, the SQUID magnetic flux meters of each vector magnetic flux meter obtain magnetic flux components in corresponding directions at different points which differ spacially from one another. The present invention obtains magnetic flux components in corresponding directions at all points which belong to the overlapping region by performing curved surface interpolation based on the detected magnetic flux components in corresponding directions, thereby accurate vector magnetic fluxes are obtained based on magnetic flux components in three directions at corresponding points.

Figure 8:
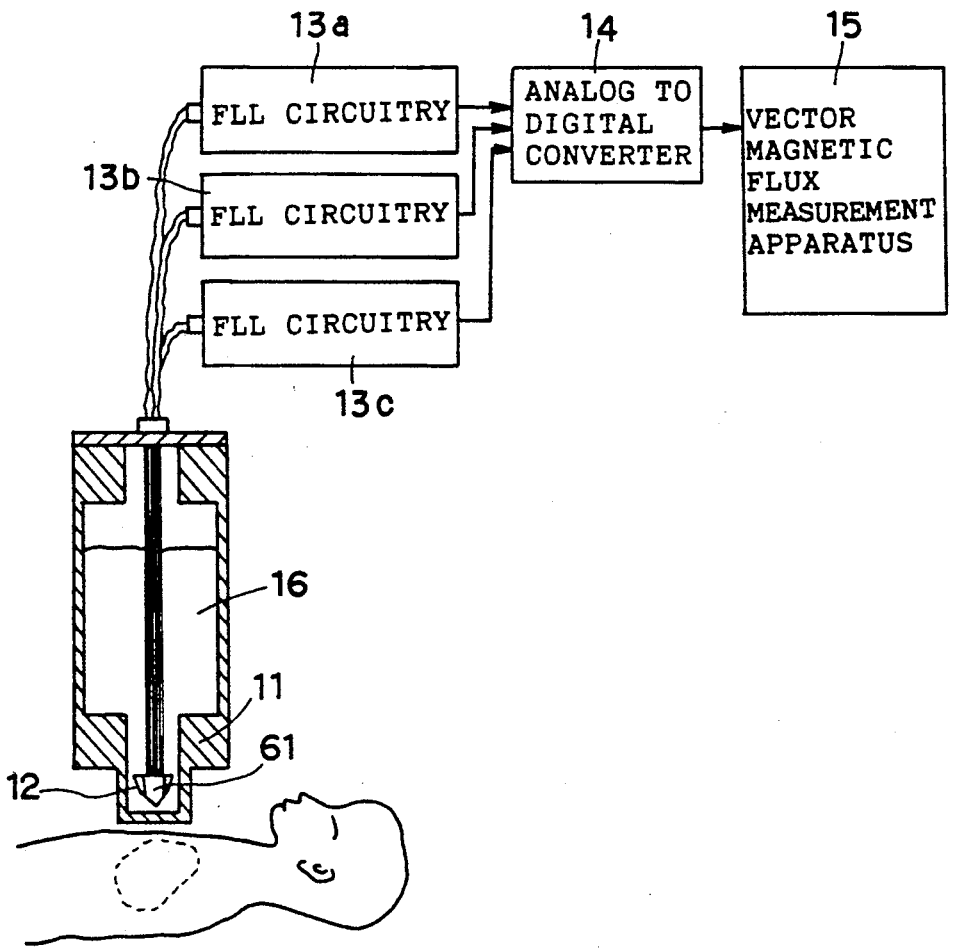
FIG. 8 is a diagram schematically illustrating a specific example in which an apparatus for measuring vector magnetic flux is applied to an apparatus for measuring magnetocardiograms.

FIG. 8 is a diagram schematically illustrating a specific example in which an apparatus for measuring vector magnetic flux is applied to an apparatus for magnetocardiogram measurement.

The apparatus for magnetocardiogram measurement comprises;

a housing 11 made from fiber reinforced plastics and the like, liquid helium 16 enclosed in the housing 11, plural vector magnetic flux meters 12 housed in the housing 11, plural FLL circuitries 13a, 13b and 13c which are interconnected to corresponding SQUID magnetic flux meters of the corresponding vector magnetic flux meters, plural analog to digital converters 14 for receiving the output signals from the corresponding FLL circuitries 13a, 13b and 13c, and plural vector magnetic flux measurement apparatus 15 for receiving the digital signals from the corresponding analog to digital converters 14.

The plural vector magnetic flux meters 12 housed in the Dewar 11 are disposed at corresponding lattice points on 6×6 grids, for example.

When this apparatus for magnetocardiogram measurement is employed, minute vector magnetic fluxes are obtained within the overlapping region which is narrowed by a predetermined region based on the relative positions of the pickup coils of the vector magnetic flux meter 12, thereby the condition of the heart is accurately recognized based on the measurement results.

The method and apparatus for measuring vector magnetic flux according to the present invention are not limited to the embodiments mentioned above. The method and apparatus may obtain an accurate vector magnetic flux in real time by performing curved surface interpolation at each time vector magnetic fluxes obtainable by vector magnetic flux meters are obtained for interpolation and three dimensionally displaying the accurate vector magnetic fluxes instead of performing curved surface interpolation after all time sequence data are obtained and held.

The terms and expressions which have been employed are used as terms of description and not of limitation, and there is no intention, in the use of such terms and expressions, to exclude equivalents of the features shown and described, or portions thereof, it being recognized that various modifications are possible within the scope of the invention as claimed.

What is claimed is:

1. A method for determining vector magnetic flux within a predetermined region based on data indicative of vector magnetic flux components, the components indicative data being obtained by plural vector magnetic flux meters disposed at predetermined relative positions within said region, each vector magnetic flux meter including a body which has plural faces crossing at predetermined angles to one another, and plural pickup coils each disposed on a corresponding one of the faces, each of the pickup coils corresponding to a SQUID flux meter whereby each vector magnetic flux meter has a corresponding plurality of SQUID flux meters, said method comprising the steps of:

measuring vector magnetic flux, which includes magnetic flux components in plural directions, said step of measuring comprising collecting data indicative of the magnetic field flux components using the plural vector magnetic flux meters to obtain collected data, and holding the collected data, performing curved surface interpolation using the held data indicative of the measured magnetic flux components in each corresponding direction to provide curved surface interpolation data, and obtaining data indicative of vector magnetic flux at arbitrary points in said predetermined region by using the curved surface interpolation data, said predetermined region being a region wherein interpolation regions corresponding to all the magnetic flux components overlap.

2. An apparatus for measuring vector magnetic flux within a predetermined region based on data obtained by plural vector magnetic flux meters disposed at predetermined relative positions within said region, each vector magnetic flux meter including a body which has plural faces crossing at predetermined angles to one another, and plural pickup coils each disposed on a corresponding one of the faces, each of the pickup coils corresponding to a SQUID flux meter whereby each vector magnetic flux meter has a corresponding plurality of SQUID flux meters, said apparatus comprising:

storing means for storing data obtained by said corresponding SQUID magnetic flux meters, said data obtained by said flux meters representing magnetic flux components in corresponding directions of a vector magnetic flux, curved surface interpolation means for reading out said data indicative of magnetic flux components from said storing means and for performing curved surface interpolation based on said read out data to provide curved surface interpolated data, and vector magnetic flux obtaining means for obtaining vector magnetic flux at an arbitrary point within said predetermined region based on relative positions of said plural pickup coils and said curved surface interpolation data, said predetermined region being a region wherein all interpolation regions corresponding to all the magnetic flux components overlap.

* * * * *